United States Patent [19]
Bradt et al.

[11] Patent Number: 5,220,685
[45] Date of Patent: Jun. 15, 1993

[54] MUTE AND AUTOMATIC RESTORE DEVICE FOR COMMUNICATIONS RECEIVERS

[76] Inventors: Gordon E. Bradt, Rte. 2 Box 470, Eureka Springs; Kenneth R. Bates, 26 Cherokee Pl., Holiday Island, both of Ark. 72632

[21] Appl. No.: 879,141

[22] Filed: Apr. 23, 1992

Related U.S. Application Data

[63] Continuation of Ser. No. 538,531, Jun. 15, 1990, abandoned.

[51] Int. Cl.$^5$ .............................................. H04B 1/16
[52] U.S. Cl. ................................. 455/194.1; 455/218; 455/352
[58] Field of Search ............... 455/174.1, 181.1, 194.1, 455/218, 219, 221, 352, 353; 358/142, 165; 334/3

[56] References Cited
U.S. PATENT DOCUMENTS
3,870,956  3/1975  Wolff .................................. 455/352
4,627,102  12/1986  Nott ................................... 455/221

OTHER PUBLICATIONS
Radio Electronics, "Commercial Killer Improves Programs", Jun. 1950, p. 44.

*Primary Examiner*—Reinhard J. Eisenzopf
*Assistant Examiner*—Andrew Faile
*Attorney, Agent, or Firm*—Boyd D. Cox

[57] ABSTRACT

The mute and automatic restore device is an apparatus for communication receivers and the like, whereby voice or code conversations or messages emanating from the monitoring speaker can be muted by the push of a button and the apparatus will determine the end of the conversation or message by sensing a preset time delay, and will then automatically restore audio output, or provide for the output to be manually restored by the pushing of a second button. The apparatus can be built into a receiver, provided as a kit to be spliced into the receiver speaker wires, or built as an accessory with a speaker and case that can simply be plugged into the speaker jack of a receiver.

4 Claims, 1 Drawing Sheet

MUTE AND AUTOMATIC RESTORE DEVICE FOR COMMUNICATIONS RECEIVERS

CROSS REFERENCE TO RELATED APPLICATIONS

This application is a continuation of application Ser. No. 07/538,531, filed Jun. 15, 1990, and now abandoned.

BACKGROUND OF THE INVENTION

When listening or monitoring voice or code messages on a radio communications receiver, the listener often finds that a message or conversation being received is of no interest, or may even be distracting to his or her other activities. The obvious and most often used response to this distraction is for the listener to turn the volume down. The problem is that the listener will then often forget to turn the volume back up, or will not know when to turn the volume back up, so as not to miss another message of importance.

In the case of scanning receivers, another alternative for the listener to mute out an undesired conversation is by actuating the lock out feature, which subsequently skips the frequency that was carrying the distracting conversation. This results in the same problem of not knowing when to restore the frequency back to active use or forgetting that the frequency has been locked out.

SUMMARY OF THE INVENTION

The principal object of the invention is to provide a device that, when activated, will mute an undesired conversation that is being received on a communications receiver, and then to automatically restore reception on that frequency once that undesired conversation has ceased. The object is to provide a device that can either be manufactured as part of a receiver as a feature, or as a kit that can be added to a receiver, or that can be built as an accessory combined with a speaker which would be plugged into the speaker jack found on most receiving units.

With continuous signals, such as occur on Radar Detectors, it is common practice to mute by means of a switch since reception can automatically be restored simply by a circuit that senses when the signal stops or drops below a certain threshold level. This approach will not work on communications voice or code conversations which occur in spurts and pauses.

The invention is based on the fact that if a pause continues for more than 10 or 20 seconds, then the great majority of communications conversations are over. So the invention involves an electronic circuit that will sense a predetermined delay time in an audio signal and then restore the audio signal volume by automatically switching off the muting circuit.

Another object of the invention is to provide the ability to manually restore a previously muted signal, even though the conversation had not ceased. An example of this use would be if a listener had activated the mute feature but later wanted to listen to the conversation, or wanted to make sure the frequency was clear before making a transmission.

Another object of the invention is to provide an adjustment that can readily be made by the user to the predetermined delay time.

Another object of the invention is to provide a means for adding the muting and automatic restore feature as an accessory for existing communications receivers. This is accomplished by either tapping into the speaker wires, or incorporating the circuitry in an auxiliary speaker case. The later is possible since most receivers, transceivers and scanners have a speaker jack that cuts out their internal speaker when an accessory speaker is plugged in. Therefore by combining the mute and automatic restore circuitry packaged in an accessory speaker and case, the invention can be utilized without internal modifications to existing receivers.

The mute and automatic restore device is a concept for communications receivers and the like, whereby a conversation or message emanating from the monitoring speaker can be muted by the push of a button; and the device will determine the end of the conversation by sensing a preset time delay, and will automatically restore the audio output, or provide for the output to be manually restored by the pushing a second button.

DESCRIPTION OF THE PREFERRED EMBODIMENT

Figure 1:
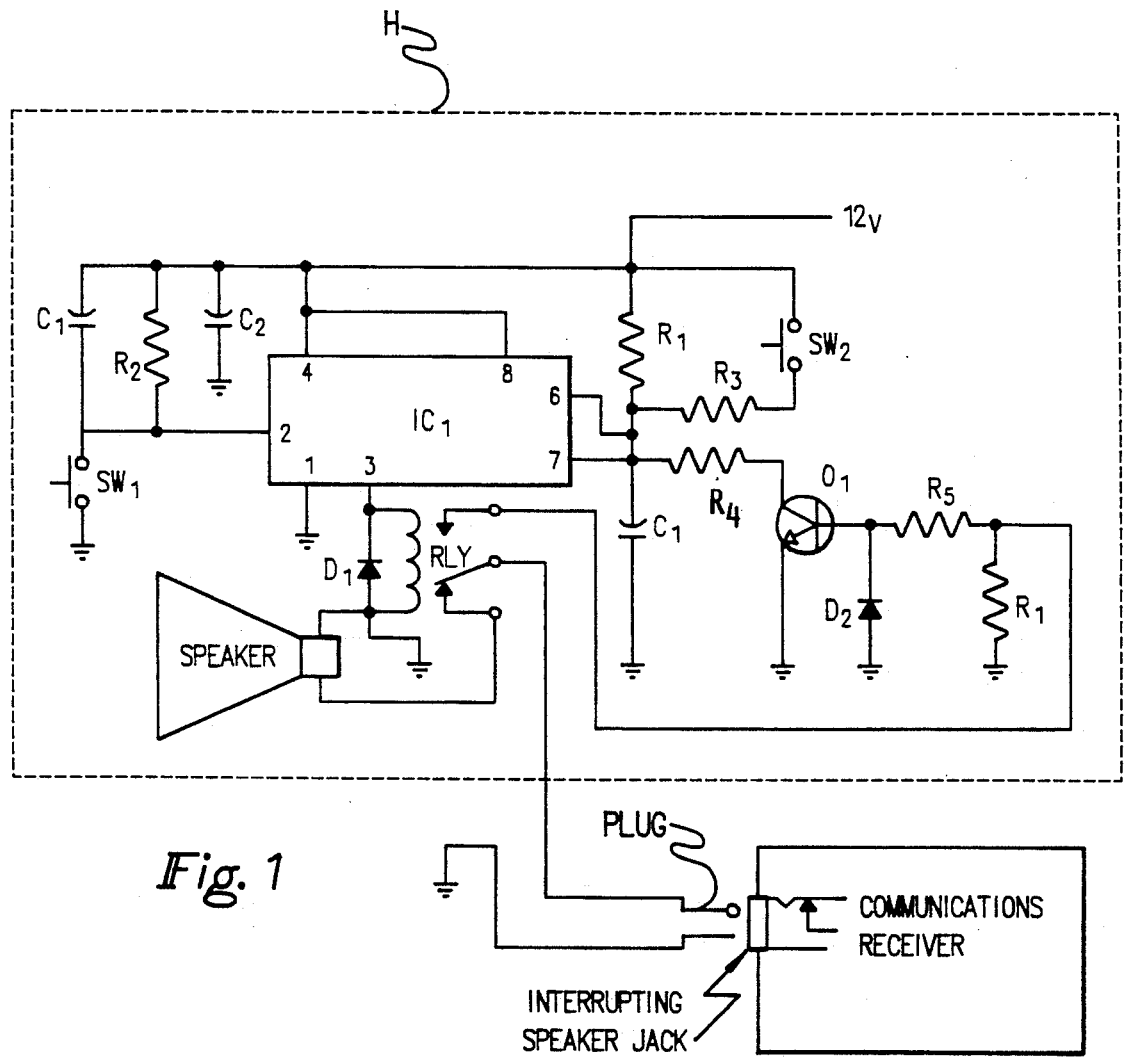
FIG. 1 is a schematic diagram illustrating a mute and automatic restore device for communication receivers according to a preferred embodiment of the present invention.

While the schematic diagram in FIG. 1 illustrates the mute and automatic restoring device in connection with a preferred embodiment disposed in a separate housing H and constructed as an accessory combined with a speaker and adapted to be plugged into the speaker jack found on most communication receivers, it should be understood that the device may also be originally manufactured as an integral feature of a communications receiver, or added as a kit thereto, without departing from the scope of the present invention.

In FIG. 1, when the normally-open push button switch SW1 is activated, the 555 timer IC1 is caused (1) to operate relay RLY to transfer the audio signal from the SPEAKER to the load resistor R1 where the audio signal is monitored by the transistor Q1 and (2) start the timing cycle whose length is determined by resistor Rt and capacitor Ct. As long as sufficient audio signal is present across resistor R1, transistor Q1 will keep capacitor Ct from charging sufficiently to complete the timing cycle by shunting capacitor Ct via resistor R4.

When the audio signal has been absent for the period of time set by the timing cycle, the capacitor Ct is allowed to charge sufficiently to trigger the timer IC1 which releases the relay RLY, thus reconnecting the speaker to the audio source.

Manual activation of the normally-open momentary switch SW2 allows the timing cycle to be terminated since it overrides transistor Q1 to charge capacitor Ct instantly via resistor R3. Capacitor C1 insures that pin 2 of the 555 timing IC1 stays high during initial power-up and capacitor C2 filters supply voltage. Diodes D1 and D2 protect IC1 and Q1 respectively from reverse voltage transients.

If resistor Rt is made a variable resistor, the time delay period may be adjusted by the user.

The foregoing description and drawing are given merely to explain and illustrate the invention and the invention is not limited thereto, except insofar as the appended claims are so limited, since those skilled in the art who have the disclosure before them will be able to make modifications and variations therein without departing from the scope of the invention.

What we claim is:

1. A mute and automatic restore device for a communications receiver, comprising:

first manually operable switch means operably connected to the receiver for muting an audio output signal from the communications receiver to allow a listener to selectively mute undesired transmissions;

sensing means operably connected to said first manually operable switch means for sensing said audio output signal upon actuation of said first manually operable switch means to mute said audio output signal;

timing means operably connected to said first manually operable switch means and said sensing means for timing a length of time for which said audio output signal is substantially absent; and automatic restore means operably connected to said first manually operable switch means, said sensing means, and said timing means for automatically restoring said audio output signal when said audio output signal has been absent for a predetermined length of time.

2. The device of claim 1, further comprising second manually operable switch means operably connected to the receiver for selectively restoring said audio output signal in advance of said automatic restore means.

3. The device of claim 1, further comprising variable adjusting means operably connected to said timing means for selectively changing said predetermined length of time.

4. The device of claim 1, wherein said device is enclosed within a housing and includes a speaker and a speaker jack adapted for connection as an accessory to said communications receiver.

* * * * *